United States Patent
Hatsch et al.

(10) Patent No.: US 10,628,084 B2
(45) Date of Patent: Apr. 21, 2020

(54) VERIFYING MEMORY ACCESS

(71) Applicant: Infineon Technologies AG, Neubiberg (DE)

(72) Inventors: Joel Hatsch, Holzkirchen (DE); Bernd Meyer, Munich (DE); Jan Otterstedt, Unterhaching (DE); Steffen Sonnekalb, Munich (DE)

(73) Assignee: Infineon Technologies AG, Neubiberg (DE)

( * ) Notice: Subject to any disclaimer, the term of this patent is extended or adjusted under 35 U.S.C. 154(b) by 21 days.

(21) Appl. No.: 16/156,046

(22) Filed: Oct. 10, 2018

(65) Prior Publication Data
US 2019/0114111 A1    Apr. 18, 2019

(30) Foreign Application Priority Data
Oct. 18, 2017   (DE) .................. 10 2017 124 313

(51) Int. Cl.

| | |
|---|---|
| *G06F 12/00* | (2006.01) |
| *G06F 13/00* | (2006.01) |
| *G06F 13/28* | (2006.01) |
| *G06F 3/06* | (2006.01) |
| *G06F 11/10* | (2006.01) |
| *G11C 7/24* | (2006.01) |
| *G11C 7/10* | (2006.01) |

(Continued)

(52) U.S. Cl.
CPC .......... *G06F 3/0659* (2013.01); *G06F 3/0604* (2013.01); *G06F 3/0673* (2013.01); *G06F 11/1004* (2013.01); *G06F 11/1076* (2013.01); *G11C 7/1006* (2013.01); *G11C 7/24* (2013.01); *G11C 8/08* (2013.01); *G06F 3/0614* (2013.01); *G06F 3/0619* (2013.01); *G06F 16/2365* (2019.01)

(58) Field of Classification Search
CPC .... G06F 3/0604; G06F 3/0614; G06F 3/0619; G06F 16/2365
USPC ........................................ 711/154
See application file for complete search history.

(56) References Cited

U.S. PATENT DOCUMENTS

| | | | |
|---|---|---|---|
| 2003/0140288 A1* | 7/2003 | Loaiza ............... | G06F 11/0727 714/718 |
| 2004/0151026 A1* | 8/2004 | Naso .................. | G11C 7/24 365/185.04 |
| 2005/0237814 A1 | 10/2005 | Li et al. | |

(Continued)

OTHER PUBLICATIONS

German Patent Office, Office Action issued for DE 102017124313.5, 6 pgs., dated Aug. 30, 2018.

*Primary Examiner* — Edward J Dudek, Jr.
*Assistant Examiner* — Sidney Li
(74) *Attorney, Agent, or Firm* — Schiff Hardin LLP (57) ABSTRACT

A memory arrangement having a memory cell field with columns and rows of writable memory cells, a memory controller which is configured to initiate an access to a first group of memory cells of a row of memory cells and, together with the access to the first group of memory cells, to initiate a read access to a second group of memory cells of the row of memory cells, and a verification circuit which is configured to check whether the access to the first group of memory cells has been performed on the correct row of memory cells on the basis of whether values read during the read access to the second group of memory cells match values previously stored by the second group of memory cells.

20 Claims, 4 Drawing Sheets

(51) Int. Cl.
  *G11C 8/08* (2006.01)
  *G06F 16/23* (2019.01)

(56) References Cited

U.S. PATENT DOCUMENTS

2010/0110803 A1\* 5/2010 Arai .................... G11C 7/1006
                                              365/189.05
2012/0311396 A1  12/2012 Andre et al.
2017/0123721 A1\* 5/2017 Sela ..................... G06F 3/0611

\* cited by examiner

VERIFYING MEMORY ACCESS

Example embodiments generally relate to a memory arrangement and a method for verifying a memory access.

Electronic devices must be protected against attacks in a multiplicity of applications. Typical examples are security ICs, Hardware Roots of Trust (e.g. Trusted Platform Module), chip cards which process and store secret data (e.g. keys or passwords) or data which are intended to be protected against manipulation (e.g. credit on a credit card), or control devices, for example in a vehicle, the correct function of which is important for the safety of the user. One possible point of attack of an electronic device is its memory which an attacker can manipulate in order to gain knowledge of secret data or impair the correct function of the electronic device. Efficient mechanisms to protect electronic memories are therefore desirable.

According to one embodiment, a memory arrangement is provided which has a memory cell field with columns and rows of writable memory cells, a memory control device which is configured to initiate an access to a first group of memory cells of a row of memory cells and, together with the access to the first group of memory cells, to initiate a read access to a second group of memory cells of the row of memory cells, and a verification circuit which is configured to check whether the access to the first group of memory cells has been performed on the correct row of memory cells on the basis of whether values read during the read access to the second group of memory cells match values previously stored by the second group of memory cells.

According to a further embodiment, a method is provided for verifying a memory access according to the memory arrangement described above.

The figures do not reflect the actual size ratios, but are intended to serve to illustrate the principles of the different example embodiments. Different example embodiments are described below with reference to the following figures.

The following detailed description relates to the attached figures which show details and example embodiments. These example embodiments are described in such detail that the person skilled in the art can implement the invention. Other embodiments are also possible and the example embodiments can be modified in structural, logical and electrical terms without deviating from the subject-matter of the invention. The different example embodiments are not necessarily mutually exclusive, but rather different embodiments can be combined with one another to produce new embodiments. In the context of this description, the terms "linked", "connected" and "coupled" are used to describe both a direct and an indirect link, a direct or indirect connection, and a direct or indirect coupling.

Electronic memories typically have a grid (two-dimensional field or array or matrix) of memory cells, wherein the rows are addressed by word lines and the columns by bit lines.

Figure 1:
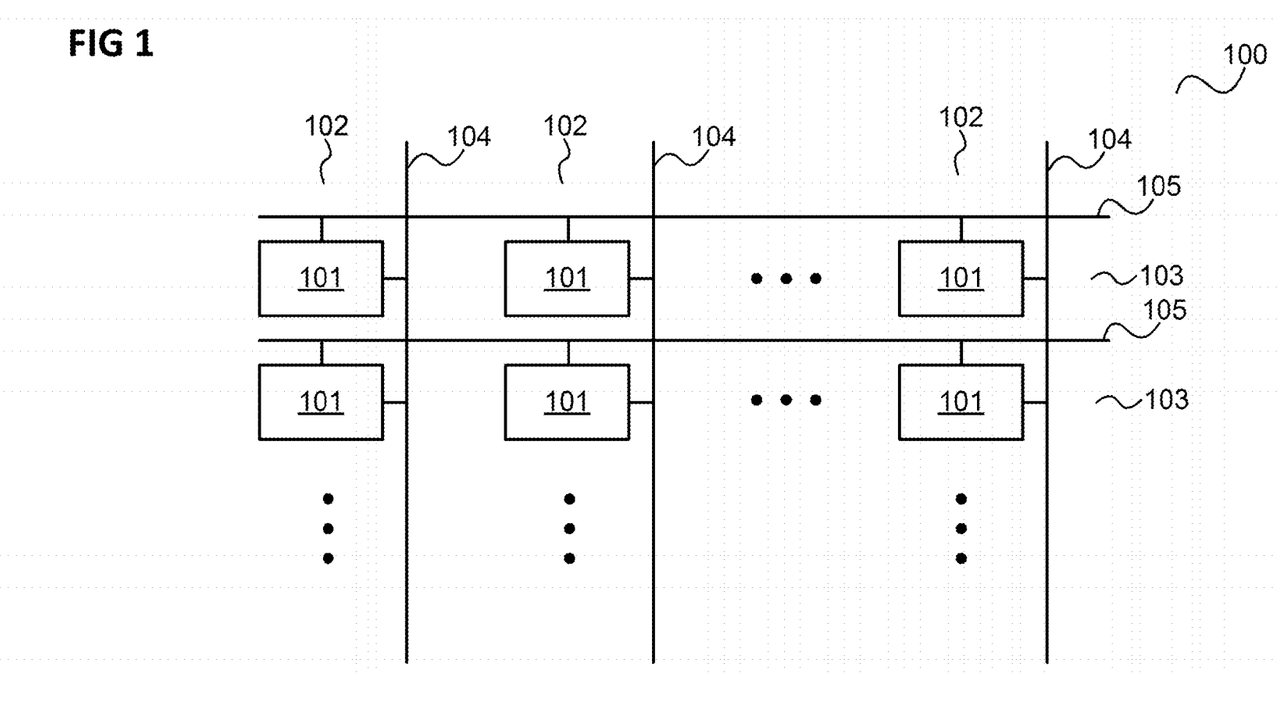
FIG. 1 shows a memory cell field.

FIG. 1 shows a memory cell field 100.

The memory cell field has a multiplicity of memory cells 101 which are arranged in the form of a matrix with columns 102 of memory cells and rows 103 of memory cells.

A bit line 104 is assigned to each column 102 of memory cells and a word line 105 is assigned to each row 103 of memory cells.

By activating a word line 105, all (or a part) of the memory cells of the row 103 addressed via this word line (i.e. the row 103 assigned to this word line) are read or written simultaneously by means of the bit lines 104.

The smallest, individually addressable quantity of memory cells 101 of a row 103 (and therefore of a word line 105) forms a memory word. The length of a memory word normally corresponds to the width of a data bus connected to the memory, e.g. 8 bits, i.e., for example, eight memory cells.

Since fields (arrays) of memory cells are, on the one hand, very easily recognizable in the layout of an integrated circuit due to their size and, on the other hand, can easily be analyzed and manipulated due to their regular basic structure, it is necessary for integrated circuits for security applications to be able to verify during operation that data are written to the correct, addressed memory cells and that the state of the memory cells has also actually changed.

The simple readback of written data can detect specific sporadic errors of a memory cell field. However, this approach is incapable of reliably detecting either persistent errors in the circuit or active attacks (for example by a forcing attack by means of probing needles or by a laser).

For safety applications (for example in the automotive sector), memory cell fields can be extended with word line address coding in order to be able to detect sporadic transient incorrect addressing of word lines or permanent defects in the memory cell field. To do this, precalculated bit patterns can be permanently inserted into the memory cell field. This can be done, for example, using techniques such as insertion of ROM cells or through suitable modification of the memory cells that are used (for example missing contacts or missing transistors of individual memory cells). These techniques enable the detection of malfunctions with a predefined redundancy, but are typically unsuitable for offering protection against active attacks. The linear codes typically used for this purpose for reasons of efficiency are furthermore not compatible with the bit-by-bit logical AND or logical OR operations by a plurality of activated word lines. Linear codes are normally defined as vector spaces over a finite body and retain their characteristics only in respect of the link mappings in this vector space. An invasive attacker can exploit this incompatibility of the operation mappings in the parts of the cell field which code the addresses of the word lines in a targeted manner in order to circumvent the error-detecting characteristics of the codes that are used through simultaneous activation of a plurality of word lines. If the read data contain no further redundant information for checking their validity, an attack of this type is not detectable.

In order to be able to achieve a sufficiently high level of protection for security applications, a small-scale interleaving between the additional ROM cells and the memory cells is desirable. In this way, it can be achieved that a potential attacker has to manipulate many locations in the cell field (for example by means of needles or lasers) in order to be successful with an attack. If the ROM cells are simply appended to one end of a memory cell row, there is only one location in the word line concerned which has to be manipulated for an attack (i.e. at the transition between RAM and ROM cells). However, a frequent changeover between RAM and ROM cells results in a considerable additional space requirement, since minimum spacings must be maintained between the different cell types in the full-custom macros for the memory cell field or guard structures must be provided.

Simple and efficient approaches for verifiable modification of memory words for security and safety applications are described below which can be used, for example, to implement a protective mechanism to secure an electronic memory, such as, for example, a RAM (Random Access Memory), a RRAM (Resistive RAM), a FeRAM (Ferroelectric RAM) or a memory of a different type in an electronic integrated circuit, for example a chip card (with any form factor), a control device (e.g. connected to a microcontroller), e.g. in a vehicle, etc.

According to one embodiment, the hardware of a memory control device (e.g. a RAM controller) enables only a part of the memory cells of a memory word to be written and thereby modified (referred to below as "partial write"). A memory word corresponds, for example, to a part of the memory cells of a memory cell row 103. A typical example is a 32-bit memory with a word length (and e.g. corresponding width of the data bus to which the memory is connected) of 8 bits, so that each memory cell row 103 stores four words. The bits are typically arranged in such a way that the first four memory cells 101 of the memory cell row 103 store the first bit of the first, second, third and fourth word, the second four memory cells 101 of the memory cell row 103 store the second bit of the first, second, third and fourth word, etc. As a result, the amount of wiring can kept relatively low. The individual words are typically accessed via multiplexers 204, 205 during reading or demultiplexers during writing. This is shown in FIG. 2.

Figure 2:
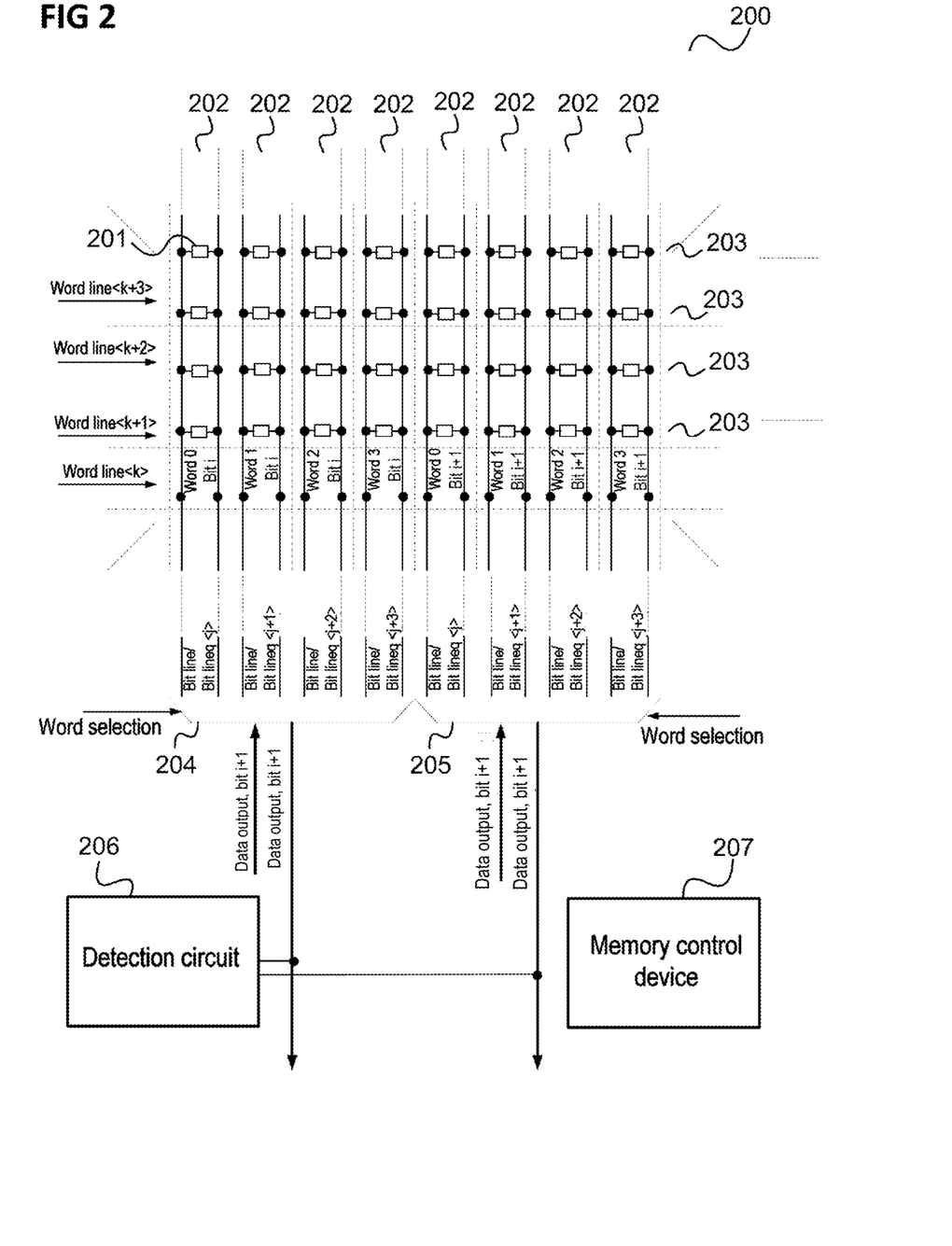
FIG. 2 shows a memory arrangement according to one embodiment.

FIG. 2 shows a memory arrangement 200 according to one embodiment.

The memory arrangement 200 has a memory cell field with a multiplicity of memory cells 201 which are arranged in the form of a matrix with columns 202 of memory cells and rows 203 of memory cells, as described with reference to FIG. 1.

A word line which is connected to the memory cells of the row is assigned to each row 203 of memory cells.

A first bit line and a second bit line (complementary bit line) which are connected to the memory cells of the column are assigned to each column 202 of memory cells.

The memory cell field stores four words (word 0 to word 3) in each row 203, wherein the memory cells which store the i-th bit of the four words and the i+1-th bit of the four words are shown in FIG. 2. The bits of the words are distributed over the row 203 in such a way that the eight memory cells of a row shown in FIG. 2 store, from left to right: i-th bit word 0, i-th bit word 1, i-th bit word 2, i-th bit word 3, i+1-th bit word 0, i+1-th bit word 1, i+1-th bit word 2, i+1-th bit word 3.

A first MUX/DEMUX (multiplexer/demultiplexer) 204 is provided for the i-th bit of the words, and a second MUX/DEMUX 205 is provided for the i+1-th bit of the words.

The first MUX/DEMUX 204 is connected to the bit lines which are connected to the memory cells which store the i-th bit of one of the memory words, and the second MUX/DEMUX 205 is connected to the bit lines which are connected to the memory cells which store the i+1-th bit of one of the memory words.

Both MUX/DEMUX 204, 205 can operate as multiplexers or demultiplexers and in each case have a data input to receive a bit to be stored and a data output to output a read bit. Both MUX/DEMUX 204, 205 furthermore have an input in each case to select the word which is intended to be read or written in the addressed row 203.

A control device 207 controls access to the memory through suitable control of the word lines and of the MUX/DEMUX 204, 205. According to one example embodiment, the control device 207 supports, in particular, a partial write access, i.e. a write access to a memory word which leaves a part of the memory word unchanged (e.g. writes bit i only, but leaves bit i+1 unchanged).

The memory arrangement 200 is, for example, part of a RAM memory. Accordingly, the memory cells 201 are, for example, RAM memory cells and the memory control device 207 is, for example, a RAM controller.

According to one embodiment, the contents of the memory cells 201 of a memory word not modified during a partial write access are used as reference patterns (reference data or reference values) in order to ensure that the state of the correct memory word (i.e. with the correct address) has been modified.

The memory arrangement 200 has, for example, a detection circuit 206 (generally a checking instance) which knows the reference pattern. The reference pattern consists of the contents of memory cells of the memory word unmodified during the partial write access. The content of each unmodified memory cell of this type is also referred to below as a reference value.

The detection circuit 206 receives the contents of memory cells of the memory word which have not been written during the partial write access (and should rightly store the reference pattern) and the data of the memory word modified during the partial write access. The contents of the memory cells of the memory word not written during the partial write access and the contents of the memory cells of the memory word modified during the partial write access are jointly read by a read access to the memory array. The detection circuit 206 can, for example, request a corresponding read access from the memory control device 207. A reread of written values can also be foregone for reasons of efficiency and a write access can be performed instead. During the write access, the unwritten values are implicitly read and compared with a reference pattern known a priori (e.g. from an earlier read access). In this case, the check remains restricted to the unwritten locations.

Any deviation of the read state from the expected state is classified by the detection circuit 206 as an attack or malfunction (in the case of a safety application). The detection circuit 206, for example, compares the content of the memory cells unwritten during the partial write access with the reference pattern and emits an alarm if they do not match one another. In one embodiment in which a reread is performed, the detection circuit 206 can furthermore compare the read content which was read during the read access to the written memory cells with the written values in order to ensure that the read access has been performed on the correct memory cell.

According to one embodiment, already existing memory contents are thus used as reference patterns for the verification (i.e. for checking whether a write procedure has been performed correctly). In particular, no additional memory cells need to be provided to store reference values. This enables a space-saving implementation.

Encrypted memory contents, for example, can be used as reference patterns. Due to the statistical characteristics of a typical memory encryption, the cipher texts used as reference patterns in this case are generally random and evenly distributed and difficult to predict. This results in a high probability that manipulations carried out by an attacker can be detected. The reproducibility of attacks is furthermore hindered.

According to one embodiment, only one type of memory cells is used. This means that the memory cells which in each case store a reference value (and together, therefore, the reference pattern) and the memory cells that are written during the partial write access are of the same type. All of the memory cells are, for example, volatile memory cells (and not, for example, one part RAM memory cells and the other parts ROM memory cells). All memory cells are, for example, RAM memory cells and can also all be of the same RAM type, e.g. all memory cells are SRAM memory cells or all memory cells are DRAM memory cells or all memory cells are RRAM memory cells or all memory cells are FeRAM memory cells.

The memory cells are, for example, all of the same type in such a way that no particular spacing needs to be maintained between a memory cell which is written during the partial write access and a memory cell which stores a reference value, i.e. no greater spacing is required than between two memory cells which are written during the partial write access or than between two memory cells which store reference values.

A high degree of interleaving of memory cells unwritten during the partial write access and memory cells written during the partial write access can thereby be achieved without having to accept a costly space disadvantage due to possible spacings or guard structures between different memory cell types. Attacks which are based on targeted invasive manipulation of a word line can be significantly hindered through a high degree of interleaving.

The memory arrangement 200 (and, in particular, the memory control device 207) can enable a group of memory cells of a memory cell row 203 to be read simultaneously and a different group of the memory cell row 203 to be written simultaneously. In an embodiment of this type, a separate read access (reread step) to read a modified memory word can be eliminated with a suitable choice of the reference values (checkbits): The memory cells of the memory word to be modified are written and the memory cells which store the reference values are read in a single partial write access. The detection circuit 206 can then directly verify the correct performance of the write procedure (by comparing the known expected reference pattern with the read reference pattern).

According to different embodiments, the partial write access is implemented in such a way that no write procedure is performed on the memory cells which are not to be modified during the partial write access. An implementation is avoided, for example, in which, as is customary during a read-modify-write access, all memory cells of the word concerned are written, wherein parts which are not intended to change are previously read and identically rewritten, since an implementation of this type separates the write procedure and the reading of the reference values into two memory accesses. A separation of this type would in fact enable the read procedure and the write procedure to be mapped by an invasive attack on different memory words (for example through manipulation of the addresses that are used), so that it could then no longer be ensured that the read memory word is also the written memory word.

One possible application of a combination of a partial write access (to a part of a memory word) with (simultaneous or subsequent) read access to (at least) one other part of the memory word is the case where two subwords A and B of a memory word are intended to be written. The current value of the subword B (before the writing) can then be used during the modification of the subword A as a reference value to check the correct write procedure, and vice versa. To do this, memory cells of the subwords A and B are, for example, interleaved in a suitable manner so that, on the one hand, a partial write access to the two memory words is possible and, on the other hand, memory cells modified in a single memory access and unmodified check cells can be jointly read. In the example shown in FIG. 2, for example, bit i of one of the four words could be part of the first subword A and bit i+1 of the word could form part of the second subword B.

In a further example embodiment, the contents of the memory cells not written during the partial write access and the memory cells written during the partial write access which could belong to a plurality of different memory words of a memory cell row are transmitted in compressed form to the checking instance. This can be achieved, for example, by reducing the contents of the memory words concerned by means of a suitable function mapping onto a single word and transmitting only the result of the function evaluation to the checking instance. The calculation of the function mapping can be performed by the hardware of the RAM controller. The function to be calculated can be selected in such a way it has specific suitable characteristics: it is selected, for example, in such a way that the result of the function evaluation depends on all memory cells relevant to the check (memory cells written during the partial write access and memory cells unwritten during the partial write access) and in such a way that the function mapping does not reduce the redundancy of the error detection by the checking instance below a required minimum of the integrity protection measure.

In one example embodiment, unique reference data are written in advance to the memory cells for use as reference values by means of a suitable initialization. The written reference data can be read and checked once completely following the initialization in order to ensure that all written reference data are different and an attacker has not, for example, made copies of entries during the initialization.

In one example embodiment, the procedure described above is used to implement a destructive read mechanism: during the destructive reading of a RAM, a data block is transferred from the RAM into a cache and the data block is set to an invalid state in the RAM. As a result, no implicit copies of data blocks are made which can possibly be misused later in replay attacks. A data block is a logically coherent area of possibly a plurality of memory words whose integrity is protected against manipulations by means of additional redundancy information. Destructive reading can be implemented, for example, in such a way that the RAM controller modifies the redundancy information of the data block during the reading of the data of the data block to the cache (data fetch) in a verifiable manner by means of a partial write access. The cache can recalculate the redundancy information in parallel from the stored data words of the data block, can similarly apply the modifications by the partial write and can compare this expected value with the transformed redundancy information read from the RAM. If the two versions of the transformed redundancy information match one another, it is thus verified that the copy of the data block in the RAM has been correctly set to an invalid state. The partial write mechanism ensures that the correct data block in the RAM has been changed to an invalid state.

A partial write access can be implemented, for example, by means of precharging of the bit lines. During the reading of data from the memory cells, the bit lines are set through precharging to an undefined value (e.g. neither 0 nor 1). If a word line is now activated and, for example, the transistors which connect the memory cells of the associated row to the bit lines are therefore opened, the current value of the memory cells defines the value on the bit lines. If the bit lines already have a fixed logical value and no precharging is carried out, the current value of the bit lines is transferred to the memory cell after the opening of the transistors of the word line and the memory cell is written.

A partial write access can now be implemented as follows: a precharging of the bit lines is carried out in the case of memory cells which are intended to be read. The bit lines are set to the value that is to be written in the case of cells which are intended to be written. If the transistors which connect the memory cells to the bit lines are now opened, memory cells are simultaneously read and written depending on whether the respective bit lines are precharged or are set to a fixed value that is to be written. This can be regarded as selective precharging.

The previous value of the bits to be implicitly read on the bit lines can furthermore be inverted before the performance of the write procedure during a partial write access. In this way, the situation can be avoided in which values possibly still stored in the bit lines from a previous read access can be used by an attack on the precharging step (suppression of the precharging of the bit lines to be implicitly read) as new values for a write procedure to a different (incorrect) at address. An attack of this type would suppress the implicit read access during a partial write and transform it into a write access.

Figure 3:
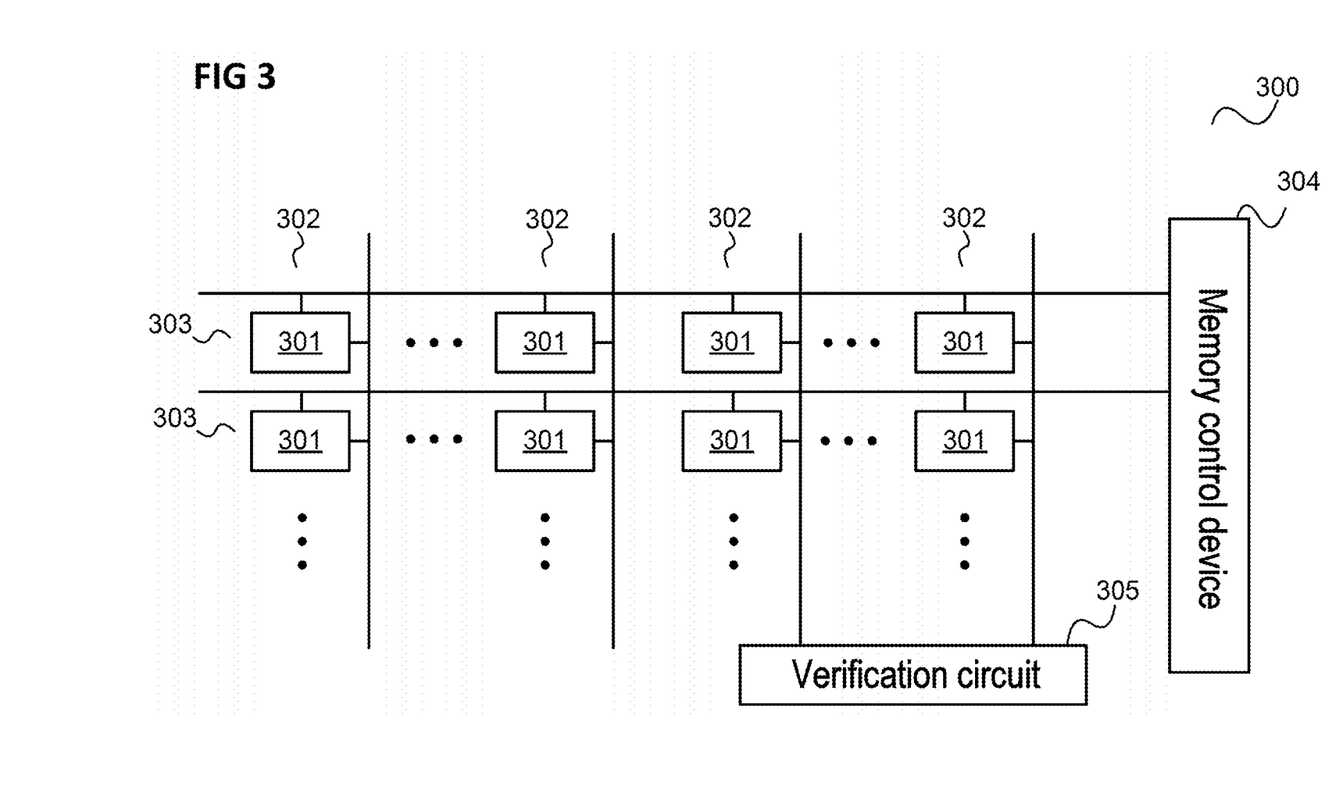
FIG. 3 shows a memory arrangement according to one embodiment.

To summarize, a memory arrangement as shown in FIG. 3 is provided according to different embodiments.

FIG. 3 shows a memory arrangement 300 according to one embodiment.

The memory arrangement 300 has a memory cell field with columns 302 and rows 303 of writable memory cells 301.

The memory arrangement 300 furthermore has a memory control device 304 which is configured to initiate an access to a first group of memory cells 301 of a row 303 of memory cells and, together with the access to the first group of memory cells 301, to initiate a read access to a second group of memory cells 301 of the row 303 of memory cells.

The memory arrangement 300 furthermore has a verification circuit 305 which is configured to check whether the access to the first group of memory cells 301 has been performed on the correct row 303 of memory cells on the basis of whether values read during the read access to the second group of memory cells 301 match values previously stored by the second group of memory cells 301.

According to one embodiment, simultaneously with the writing or reading of first memory cells of a row, second memory cells of the row are read and the read contents are compared with expected contents of the second memory cells in order to check whether the accesses to the first memory cells and second memory cells have been performed on the correct row.

The verification circuit can in turn store the values stored by the memory cells 301 as a reference, for example if they are written as a reference to the second memory cells, so that it can then compare the read values with the reference.

The initiation of an access entails, for example, the generation and transmission of an activation signal for a respective word line, the generation and transmission of a precharge signal and/or the generation and transmission of a control signal for one or more multiplexers/demultiplexers (MUX/DEMUX). The initiation of an access to a memory cell row does not necessarily have to result in the performance of the access to the memory cell row, since, for example, the incorrect word line has been activated e.g. due to an attack. The checking of the verification circuit can therefore be regarded as a check to determine whether an access of this type has been performed as it was initiated.

According to different embodiments, a checking method is carried out which is based on a combination of a partial write access and a read access to bits left unchanged by the partial write access. The read access can form part of a reread access to bits written during the partial write access (and to the bits left unchanged by the partial write access). The bits left unchanged by the partial write access are used as reference patterns for the implicit verification of the write procedure and the address of the written memory word.

To do this, the reference pattern must be known to the checking instance (i.e. the verification circuit 305 in the example shown in FIG. 3). Memory cells changed during the partial write access and memory cells left unchanged during the partial write access are, for example, read simultaneously during a reread access by means of a single memory access. If memory cells changed during the partial write access and memory cells left unchanged during the partial write access are read separately, an access to the respective address of the read memory cells is again possible in the meantime.

Through small-scale interleaving of memory cells changed during the partial write access and memory cells left unchanged during the partial write access along the row of memory cells, an attack based on an invasive attack on the word lines of the memory cell arrangement is significantly impeded.

According to one embodiment, the access to the first group of memory cells is a read access. The memory control device can be configured, for example, to perform a write access to the first group of memory cells before the read access to the first group of memory cells, i.e. the access to the first group of memory cells can be a reread of previously written data. The verification circuit can be configured to check whether the write access to the first group of memory cells has been performed on the correct row of memory cells, additionally on the basis of whether values read during the read access to the first group match the values written during the write access.

The memory control device can pre-initialize the second group of memory cells with a pattern identifying the second group of memory cells as a reference or reference pattern, e.g. with the memory address itself, possibly in conjunction with a subsequent reread of all initialization values in order to be able to verify the correct memory position later during the reading and also during the writing (by means of partial writing).

Figure 4:
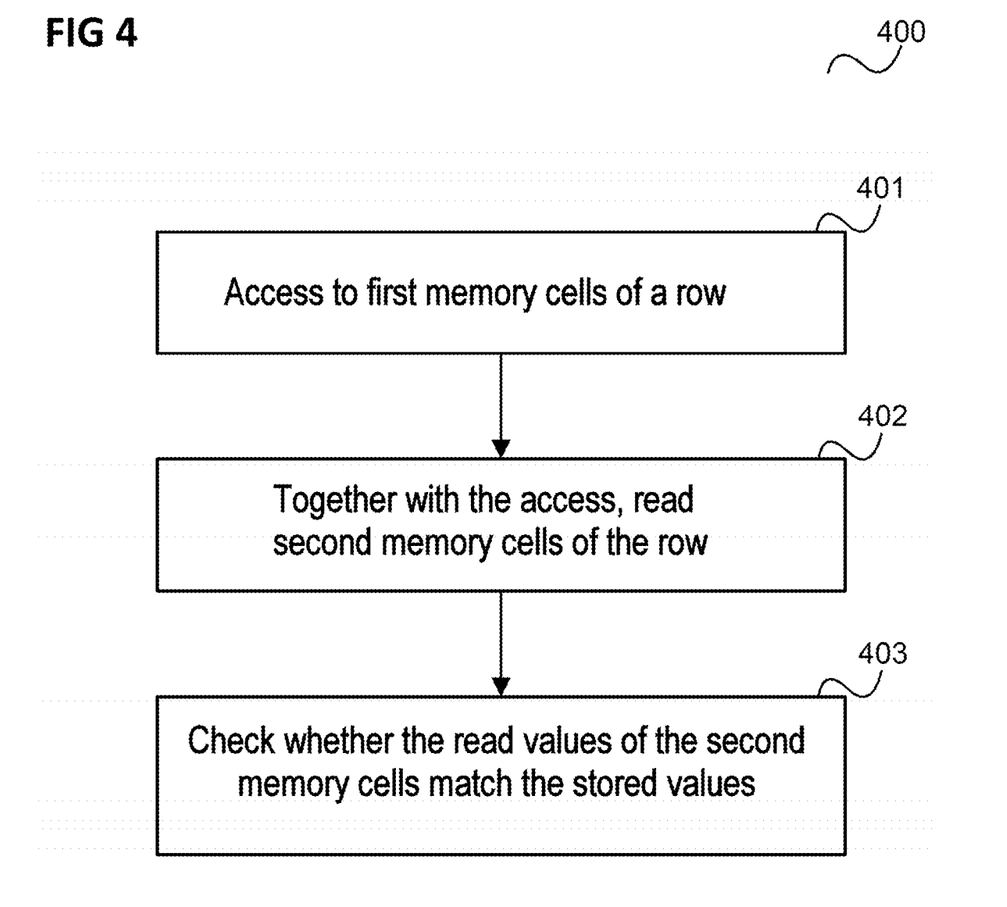
FIG. 4 shows a flow diagram which illustrates a method for verifying a memory access.

FIG. 4 shows a flow diagram 400 which illustrates a method for verifying a memory access.

In 401, an access to a first group of memory cells of a row of memory cells of a memory cell field is initiated.

In 402, together with the access to the first group of memory cells, a read access to a second group of memory cells of the row of memory cells is initiated.

In 403, a check is carried out to determine whether the access to the first group of memory cells has been performed on the correct row of memory cells on the basis of whether values read during the read access to the second group of memory cells match values previously stored by the second group of memory cells.

To summarize, some example embodiments are indicated below.

Example embodiment 1 is a memory arrangement as shown in FIG. 3.

Example embodiment 2 is a memory arrangement according to example embodiment 1, wherein the access to the first group of memory cells is a write access.

Example embodiment 3 is a memory arrangement according to example embodiment 1, wherein the first group of memory cells and the second group of memory cells form part of a memory word of the memory cell field.

Example embodiment 4 is a memory arrangement according to example embodiment 3, wherein the write access to the first group of memory cells is a partial write access to the memory word.

Example embodiment 5 is a memory arrangement according to example embodiment 3 or 4, wherein the write access to the first group of memory cells is an invalidation of the memory word.

Example embodiment 6 is a memory arrangement according to example embodiment 5, wherein the memory word has redundancy information and the invalidation entails a modification of the memory word so that the redundancy information for the memory word is invalid.

Example embodiment 7 is a memory arrangement according to one of example embodiments 3 to 6, wherein the write access to the first group of memory cells is an invalidation of redundancy information of the memory word which is stored in the first group of memory cells.

Example embodiment 8 is a memory arrangement according to one of example embodiments 3 to 7, wherein the write access to the first group of memory cells is an invalidation of an error correction code or an error detection code of the memory word which is stored in the first group of memory cells.

Example embodiment 9 is a memory arrangement according to one of example embodiments 1 to 8, wherein the memory cell field has bit lines and word lines, wherein a bit line is assigned to each column of memory cells and a word line is assigned to each row of memory cells and wherein the memory control device is configured to initiate the access to the first group of memory cells and the read access to the second group of memory cells together by activating a word line which is assigned to the row of memory cells to which the first group of memory cells and the second group of memory cells belong.

Example embodiment 10 is a memory arrangement according to one of example embodiments 1 to 9, wherein the memory control device is configured to initiate the access to the first group of memory cells and the read access to the second group of memory cells for the same activation of a word line.

Example embodiment 11 is a memory arrangement according to one of example embodiments 1 to 10, wherein the memory cells of the first group of memory cells and the memory cells of the second group of memory cells alternate at least partially along the row of memory cells.

Example embodiment 12 is a memory arrangement according to one of example embodiments 1 to 11, wherein the verification circuit has a memory which is configured to store the values stored by the second group of memory cells.

Example embodiment 13 is a memory arrangement according to one of example embodiments 1 to 12, wherein the memory control device is configured to pre-initialize the second group of memory cells with a pattern identifying the second group of memory cells.

Example embodiment 14 is a method for verifying a memory access, as shown in FIG. 4.

Example embodiment 15 is a method according to example embodiment 14, wherein the access to the first group of memory cells is a write access.

Example embodiment 16 is a method according to example embodiment 14, wherein the first group of memory cells and the second group of memory cells form part of a memory word of the memory cell field.

Example embodiment 17 is a method according to example embodiment 16, wherein the write access to the first group of memory cells is a partial write access to the memory word.

Example embodiment 18 is a method according to example embodiment 16 or 17, wherein the write access to the first group of memory cells is an invalidation of the memory word.

Example embodiment 19 is a method according to example embodiment 18, wherein the memory word has redundancy information and the invalidation entails a modification of the memory word so that the redundancy information for the memory word is invalid.

Example embodiment 20 is a method according to one of example embodiments 16 to 19, wherein the write access to the first group of memory cells is an invalidation of redundancy information of the memory word which is stored in the first group of memory cells.

Example embodiment 21 is a method according to one of example embodiments 16 to 20, wherein the write access to the first group of memory cells is an invalidation of an error correction code or an error detection code of the memory word which is stored in the first group of memory cells.

Example embodiment 22 is a method according to one of example embodiments 14 to 21, wherein the memory cell field has bit lines and word lines, wherein a bit line is assigned to each column of memory cells and a word line is assigned to each row of memory cells and wherein the access to the first group of memory cells and the read access to the second group of memory cells are initiated together by activating a word line which is assigned to the row of memory cells to which the first group of memory cells and the second group of memory cells belong.

Example embodiment 23 is a method according to one of example embodiments 14 to 22, wherein the access to the first group of memory cells and the read access to the second group of memory cells are initiated for the same activation of a word line.

Example embodiment 24 is a method according to one of example embodiments 14 to 23, wherein the memory cells of the first group of memory cells and the memory cells of the second group of memory cells alternate at least partially along the row of memory cells.

Example embodiment 25 is a method according to one of example embodiments 14 to 24, wherein the check is carried out by a verification circuit which has a memory which stores the values stored by the second group of memory cells.

Example embodiment 26 is a method according to one of example embodiments 14 to 25, wherein the second group of memory cells is reinitialized with a pattern identifying the second group of memory cells.

It should be noted that all of the aforementioned example embodiments can be combined with one another in any required manner.

Although the invention has been shown and described above all with reference to specific embodiments, it should be understood by those persons who are familiar with the technical field that numerous modifications can be made in respect of the design and details without deviating from the essence and scope of the invention as defined by the following claims. The scope of the invention is therefore defined by the attached claims, and it is intended that all modifications which fall within the meaning or equivalence range of the claims are encompassed.

The invention claimed is:

1. A memory arrangement, comprising:
    a memory cell field with columns and rows of writable memory cells;
    a memory controller which is configured:
        to initiate an access to a first group of memory cells of a row of memory cells; and
        together with the access to the first group of memory cells, to initiate a read access to a second group of memory cells of the row of memory cells; and
    a verification circuit which is configured to check whether the access to the first group of memory cells has been performed on the correct row of memory cells on the basis of whether values read during the read access to the second group of memory cells match values previously stored by the second group of memory cells.

2. The memory arrangement as claimed in claim 1, wherein the access to the first group of memory cells is a write access.

3. The memory arrangement as claimed in claim 1, wherein the first group of memory cells and the second group of memory cells form part of a memory word of the memory cell field.

4. The memory arrangement as claimed in claim 2, wherein the write access to the first group of memory cells is a partial write access to the memory word.

5. The memory arrangement as claimed in claim 2, wherein the write access to the first group of memory cells is an invalidation of the memory word.

6. The memory arrangement as claimed in claim 5, wherein the memory word comprises redundancy information and the invalidation entails a modification of the memory word so that the redundancy information for the memory word is invalid.

7. The memory arrangement as claimed in claim 2, wherein the write access to the first group of memory cells is an invalidation of redundancy information of the memory word which is stored in the first group of memory cells.

8. The memory arrangement as claimed in claim 2, wherein the write access to the first group of memory cells is an invalidation of an error correction code or an error detection code of the memory word which is stored in the first group of memory cells.

9. The memory arrangement as claimed in claim 1, wherein the memory cell field has bit lines and word lines, wherein a bit line is assigned to each column of memory cells and a word line is assigned to each row of memory cells, and wherein the memory controller is configured to initiate the access to the first group of memory cells and the read access to the second group of memory cells together by activating a word line which is assigned to the row of memory cells to which the first group of memory cells and the second group of memory cells belong.

10. The memory arrangement as claimed in claim 9, wherein the memory controller is configured to initiate the access to the first group of memory cells and the read access to the second group of memory cells for the same activation of a word line.

11. The memory arrangement as claimed in claim 1, wherein the memory cells of the first group of memory cells and the memory cells of the second group of memory cells alternate at least partially along the row of memory cells.

12. The memory arrangement as claimed in claim 1, wherein the verification circuit comprises a memory which is configured to store the values stored by the second group of memory cells.

13. The memory arrangement as claimed in claim 1, wherein the memory controller is configured to pre-initialize the second group of memory cells with a pattern identifying the second group of memory cells.

14. A method for verifying a memory access, comprising:
    initiating, by a memory controller, an access to a first group of memory cells of a row of memory cells of a memory cell field;
    together with the access to the first group of memory cells, initiating, by the memory controller, a read access to a second group of memory cells of the row of memory cells; and
    checking, by the memory controller, whether the access to the first group of memory cells has been performed on the correct row of memory cells on the basis of whether values read during the read access to the second group of memory cells match values previously stored by the second group of memory cells.

15. The method as claimed in claim 14, wherein the access to the first group of memory cells is a write access.

16. The method as claimed in claim 15, wherein the write access to the first group of memory cells is an invalidation of redundancy information of the memory word which is stored in the first group of memory cells.

17. The method as claimed in claim 15, wherein the write access to the first group of memory cells is an invalidation of an error correction code or an error detection code of the memory word which is stored in the first group of memory cells.

18. The method as claimed in claim 14,
    wherein the memory cell field has bit lines and word lines, wherein a bit line is assigned to each column of memory cells and a word line is assigned to each row of memory cells, and
    wherein the method further comprises the memory controller initiating the access to the first group of memory cells and the read access to the second group of memory cells together by activating a word line which is assigned to the row of memory cells to which the first group of memory cells and the second group of memory cells belong.

19. The method as claimed in claim 18, further comprising the memory controller initiating the access to the first group of memory cells and the read access to the second group of memory cells for the same activation of a word line.

20. The method as claimed in claim 14, further comprising the memory controller pre-initializing the second group of memory cells with a pattern identifying the second group of memory cells.

* * * * *